US006731556B2

(12) United States Patent
Derner et al.

(10) Patent No.: US 6,731,556 B2
(45) Date of Patent: *May 4, 2004

(54) DRAM WITH BIAS SENSING

(75) Inventors: Scott Derner, Meridian, ID (US);
Casey Kurth, Eagle, ID (US); Phillip G. Wald, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/375,626

(22) Filed: Feb. 27, 2003

(65) Prior Publication Data

US 2003/0128609 A1 Jul. 10, 2003

Related U.S. Application Data

(63) Continuation of application No. 10/017,868, filed on Dec. 12, 2001, now Pat. No. 6,603,693.

(51) Int. Cl.[7] ................................................ G11C 7/02
(52) U.S. Cl. ...................... 365/210; 365/207; 365/190
(58) Field of Search ................................ 365/210, 203, 365/205, 207, 189.08, 190, 189.09

(56) References Cited

U.S. PATENT DOCUMENTS 6,347,059 B2 * 2/2002 Bohm et al. ................. 365/210

* cited by examiner

*Primary Examiner*—David Lam
(74) *Attorney, Agent, or Firm*—Leffert Jay & Polglaze, P.A.

(57) ABSTRACT

A DRAM improves cell read margins using bias, or reference, circuitry. The reference circuitry is coupled to a complimentary digit line to improve a differential voltage with an active digit line. One embodiment, improves one's margin by decreasing the complimentary digit line voltage. The reference circuitry can be an un-programmed DRAM cell, a non-volatile ROM memory cell or a conductor coupled to a reference voltage.

38 Claims, 3 Drawing Sheets

DRAM WITH BIAS SENSING

RELATED APPLICATION

This is a Continuation application of U.S. patent application Ser. No. 10/017,868, filed Dec. 12, 2001 now U.S. Pat. No. 6,603,693, titled "DRAM WITH BIAS SENSING" and commonly assigned, the entire contents of which are incorporated herein by reference.

TECHNICAL FIELD OF THE INVENTION

The present invention relates generally to memory devices and in particular the present invention relates to dynamic random access memories (DRAM).

BACKGROUND OF THE INVENTION

Semiconductor memory systems are comprised of two basic elements: memory storage areas and memory control areas. DRAM, for example, includes a memory cell array, which stores information, and peripheral circuitry, which controls the operation of the memory cell array. A DRAM cell is an addressable location that can store one bit (binary digit) of data. In its most common form, a DRAM cell consists of two circuit components: a storage capacitor and an access field effect transistor. The capacitor holds the value of each cell, namely a logic "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

The transistor of a DRAM cell is a switch to let control circuitry either read the capacitor value or to change its state. The transistor is controlled by a row line coupled to its gate connection. In a read operation, the transistor is activated and sense amplifiers coupled to bit lines (columns) determine the level of charge stored in the memory cell capacitor, and reads the charge out as either a "1" or a "0" depending upon the level of charge in the capacitor. The sense amplifier circuitry typically has balanced pull-up and pull-down circuitry.

The read margin of a DRAM memory cell is defined as the difference between a charge level stored on the memory cell and a sensing level, or threshold, of the sense amplifier. In some designs, it may be desirable to increase the data 'one' cell margin. This is typically accomplished by storing more charge on the memory cell or reducing the leakage of the cell. This solution, however, has some drawbacks such as layout, cost and power requirements.

For the reasons stated above, and for other reasons stated below which will become apparent to those skilled in the art upon reading and understanding the present specification, there is a need in the art for a DRAM in which the memory cell margin can be adjusted.

SUMMARY OF THE INVENTION

The above-mentioned problems with DRAM's and other problems are addressed by the present invention and will be understood by reading and studying the following specification.

In one embodiment, a memory device comprises a plurality of memory cell capacitors, digit lines selectively couplable to the plurality of memory cell capacitors, sense circuitry coupled to the digit lines, and a reference cell coupled to the sense circuitry to force a differential voltage between the digit lines.

A DRAM memory device comprises a plurality of memory cell capacitors, row lines selectively couplable to the plurality of memory cell capacitors, and sense circuitry couplable to first and second digit lines. A reference line contains a charge having a voltage of X, where $Vss<X<½ Vcc$. The reference line is couplable to the second digit line. Control circuitry is provided to activate one of the row lines and couple the second digit line to the sense amplifier such that the second digit line voltage is reduced below ½ Vcc.

A method of reading a memory cell comprises equilibrating first and second digit lines to a common voltage, accessing the memory cell and coupling the memory cell to the first digit line, and coupling a reference cell to the second digit line. The reference cell decreases a voltage of the second digit line below the common voltage. A differential voltage between the first and second digit lines is then sensed.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
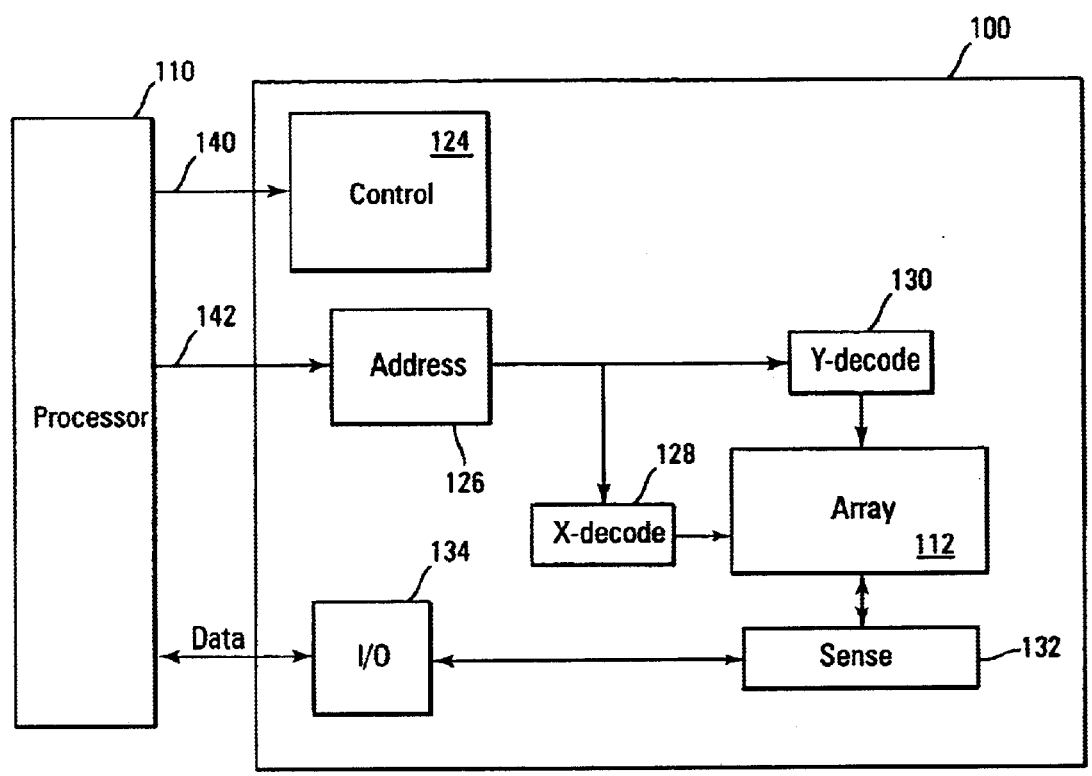
FIG. 1 is a simplified block diagram of a memory of an embodiment of the present invention.

Referring to FIG. 1, a simplified block diagram of a DRAM 100 of one embodiment of the present invention is described. The memory device can be coupled to a processor 110 for bi-directional data communication. The memory includes an array of memory cells 112. Control circuitry 124 is provided to manage data storage and retrieval from the array in response to control signals 140 from the processor. Address circuitry 126, X-decoder 128 and Y-decoder 130 analyze address signals 142 and storage access locations of the array. Sense circuitry 132 is used to read data from the array and couple output data to I/O circuitry 134. The I/O circuitry operates in a bi-directional manner to receive data from processor 110 and pass this data to array 112. It is noted that the sense circuitry may not be used in some embodiments to store the input data.

Dynamic memories are well known, and those skilled in the art will appreciate that the above-described DRAM has been simplified to provide a basic understanding of DRAM technology and is not intended to describe all of the features of a DRAM.

A sense amplifier bias technique is described in U.S. Pat. No. 6,075,737 entitled "Row Decoded Biasing of Sense Amplifier for improved One's Margin." This patent describes a sensing circuit used in a DRAM that improves cell margin. The present invention addresses many of the same issues as U.S. Pat. No. 6,075,737, but in a different manner.

Figure 2:
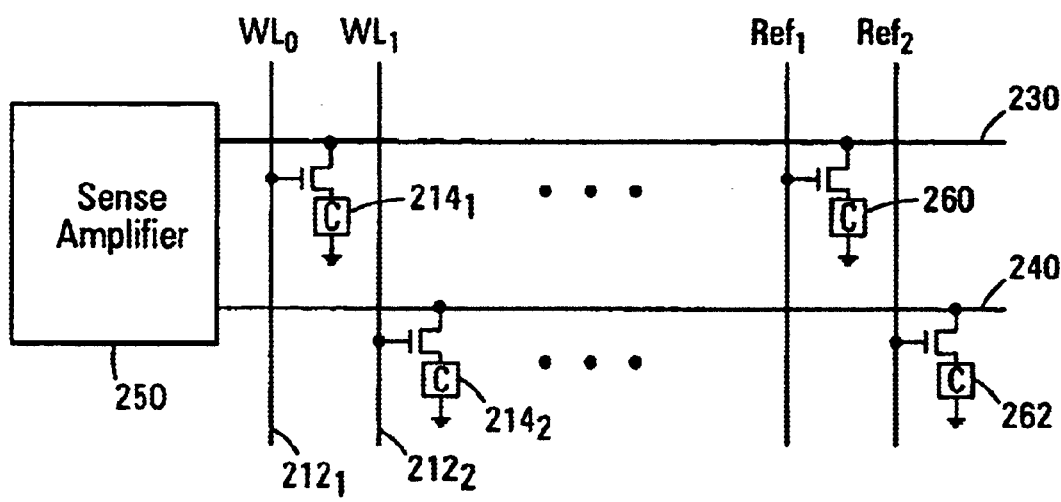
FIG. 2 illustrates a portion of a DRAM array of an embodiment of the present invention.

Referring to FIG. 2, a portion of a DRAM array of an embodiment of the present invention is described. The array includes a pair of digit lines 230 and 240 coupled to a differential voltage sense amplifier circuit 250. Each digit line can be selectively coupled to reference memory cells 260 and 262 to provide a differential voltage between the digit lines. In one embodiment, reference cell, or voltage source, 260 is coupled to the active digit line 230 to bias the digit line toward an un-programmed state. In a complementary embodiment, reference cell 262 is coupled to reference digit line 240 to bias the reference digit line toward a programmed cell state. The reference cells can be non-volatile cells, such as ROM cells, coupled to an intermediate voltage level X, such as $Vss<X<½ Vcc$. Alternatively, the reference cells can be DRAM capacitor cells that contain an appropriate charge that moves its corresponding digit line voltage. For example, the DRAM cell can be un-programmed (discharged) and reduce the digit line voltage by charge sharing. Further, the reference cell can be a hard short or conductor coupled to a voltage source. The hard short can be coupled to the digit line for a pre-determined time period to reduce the digit line voltage.

Figure 3:
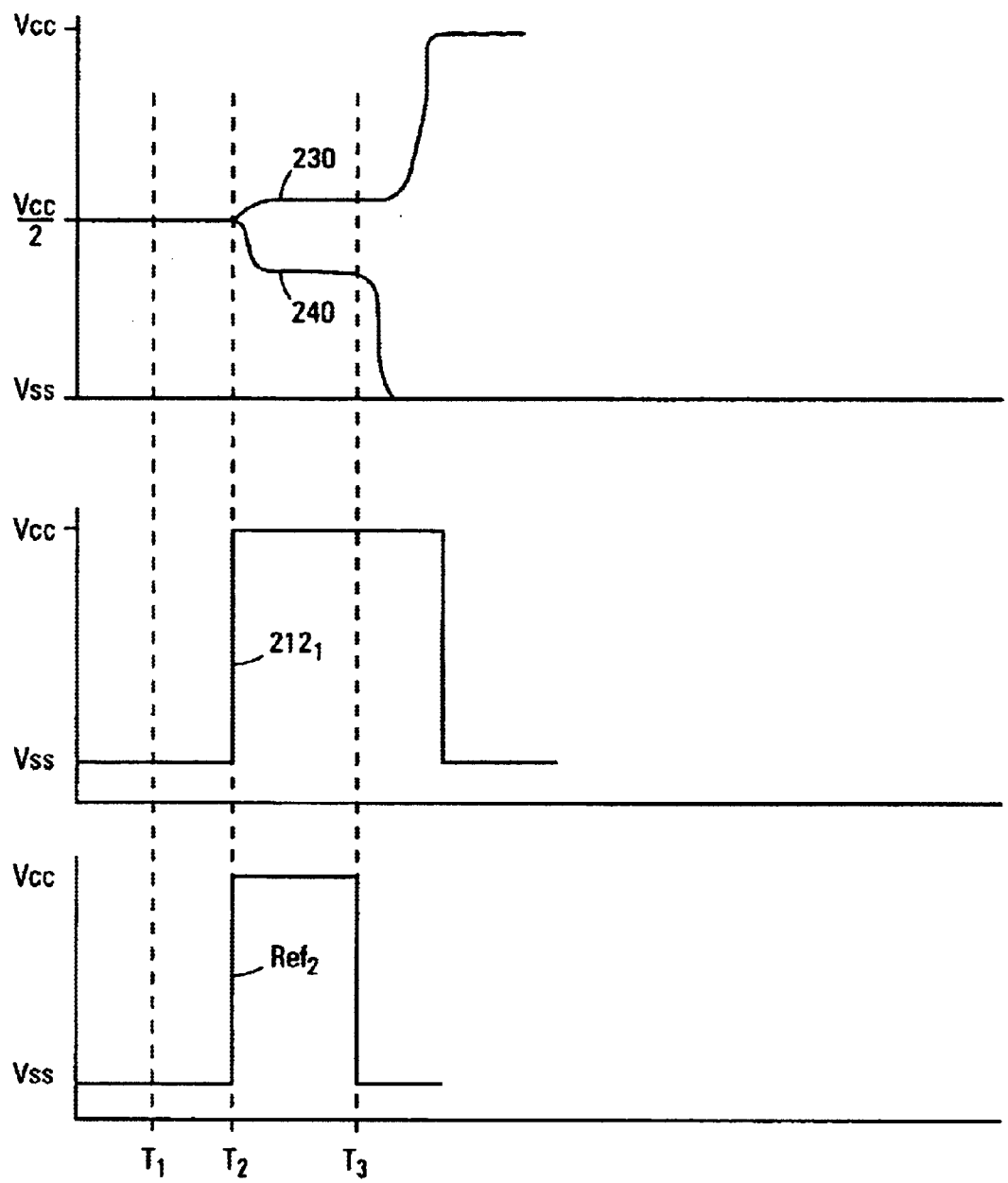
FIG. 3 illustrates a timing diagram of the memory of FIG. 2.

As illustrated in the timing diagram of FIG. 3, at time T1 the bit lines 230 and 240 are equilibrated to ½ Vcc. At time T2, the memory cell wordline $212_1$ is activated. At the same time, the reference wordline, $Ref_2$, is activated to couple reference cell 262 to the complimentary digit line 240. If the memory cell $214_1$ is programmed as a one (charged) the active digit line increases above ½ Vcc and the reference digit line voltage is decreased in response to the reference cell. That is, the reference cell couples digit line 240 to a voltage in the range of $Vss<X<½ Vcc$. If the memory cell $214_1$ has lost some of its charge, the voltage on digit line 230 may not change enough to accurately sense the memory cell without changing the digit line reference voltage. The reference cell, therefore, decreases the complimentary digit line 240 to improve the cell margin of the DRAM cells. Conversely, if a memory cell is coupled to digit line 240 by activation of memory cell wordline $212_2$, reference wordline, $Refl_1$, is activated to couple reference cell 260 to digit line 230 (not illustrated). The reference can be coupled to the complimentary digit line either before, simultaneously or after the active memory cell has been accessed, but prior to activating the sense circuitry. At time T3, the sense amplifier circuitry is activated to amplify the digit line voltages to the supply rails. The reference cell is also turned off at this time.

In the above example, memory cells programmed to a one have been read. When the memory cell is programmed to a zero (discharged) both digit line voltages are reduced. As such, the reference cell capacitance and/or voltage level is chosen to move the reference digit line voltage less than the active digit line. That is, a sufficient differential voltage must be maintained to accurately read a zero memory cell. The improved structure and method provides a greater, or expanded, signal detection range for signifying a logical "1." In other words, the margin for detecting a logical "1," or "one's margin," has been improved. A margin, or portion, of the signal detecting range traditionally allotted for logical "0" is required to expand the "one's margin." The expanded logical "1" signal detection range can allow the voltage level in the "sensed" cell to fall as far down as the digitline equilibrated value of Vcc/2 (also referred to as DVC2) before it will fail to read out as a logical "1." However, the accuracy of detecting a logical "0" is not significantly restricted.

Another notable advantage to the present invention is that favoring a logical "1" in the sensing operation requires less charge to store a logical "1" in a memory cell. This helps to reduce the negative effects of capacitive coupling between the digit lines and other memory cells in the memory array. Still another advantage of the present invention is that the circuit design reduces memory cell charge leakage rate. To explain, logical "1's" do not normally leak away in a linear fashion. That is, as the voltage in the memory cell drops, the rate of leakage decreases. The improved sensing capability of the present invention allows a smaller voltage to be stored in individual memory cells and still obtain an accurate logical "1" detection. The slower rate of leakage in the DVC2 voltage range also helps improve, or increase, the logical "1's" refresh period. The refresh period is the amount of time between when a cell containing a logical "1" must be refreshed, to account for charge leakage.

Conclusion

A DRAM has been described that improves cell read margins using bias, or reference, circuitry. The reference circuitry is coupled to a complimentary digit line to improve a differential voltage with an active digit line. One embodiment, improves one's margin by decreasing the complimentary digit line voltage. The reference circuitry can be a pre-programmed DRAM cell, a non-volatile ROM memory cell or a conductor coupled to a voltage source.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. For example, in another embodiment, the reference cells can provide a reference voltage in the range of $½ Vcc<X<Vcc$. This embodiment improves the zero margin, but reduces the ones margin. That is, the reference digit line is slightly increased when the reference cell is accessed. Thus, a memory cell programmed as a one will increase the active digit line. Therefore, it is manifestly intended that this invention be limited only by the claims and the equivalents thereof.

What is claimed is:

1. A memory device, comprising:

a plurality of memory cell capacitors;

first and second word lines selectively couplable to the plurality of memory cell capacitors;

first and second digit lines;

sense circuitry couplable to the first and second digit lines;

a reference line containing a charge having a voltage between Vss and ½ Vcc, the reference line couplable to the second digit line; and control circuitry to activate one of the word lines and couple the second digit line to the sense amplifier such that the second digit line voltage is reduced below ½ Vcc.

2. The memory device of claim 1, wherein the digit lines comprise an active digit line and a complementary digit line, and where the reference line is couplable to the complementary digit line when one of the memory cell capacitors is coupled to the active digit line.

3. The memory device of claim 1, wherein the reference line comprises a non-volatile memory cell.

4. The memory device of claim 1, wherein the reference line comprises a dynamic random access (DRAM) memory cell.

5. The memory device of claim 1, wherein the reference line comprises a hard short to a voltage source.

6. The memory device of claim 1, wherein the reference line comprises a conductor coupled to a voltage source.

7. A memory device, comprising:
a plurality of memory cell capacitors;
first and second word lines selectively couplable to the plurality of memory cell capacitors;
first and second digit lines;
sense circuitry couplable to the first and second digit lines;
a reference line containing a charge having a voltage between ½ Vcc and Vcc, the reference line couplable to the second digit line; and
control circuitry to activate one of the word lines and couple the second digit line to the sense amplifier such that the second digit line voltage is reduced below ½ Vcc.

8. The memory device of claim 7, wherein the digit lines comprise an active digit line and a complementary digit line, and where the reference line is couplable to the complementary digit line when one of the memory cell capacitors is coupled to the active digit line.

9. The memory device of claim 7, wherein the reference line comprises a non-volatile memory cell.

10. The memory device of claim 7, wherein the reference line comprises a dynamic random access (DRAM) memory cell.

11. The memory device of claim 7, wherein the reference line comprises a hard short to a voltage source.

12. The memory device of claim 7, wherein the reference line comprises a conductor coupled to a voltage source.

13. A memory device comprising:
a plurality of memory cell capacitors;
first and second word lines selectively couplable to the plurality of memory cell capacitors;
first and second digit lines;
sense circuitry couplable to the first and second digit lines;
first and second reference lines, each containing a charge having a voltage between Vss and ½ Vcc, the first reference line couplable to the second digit line and the second reference line couplable to the first digit line; and
control circuitry to activate one of the word lines and couple the first or the second digit line to the sense amplifier such that the first or second digit line voltage is reduced below ½ Vcc.

14. The memory device of claim 13, wherein the reference lines each comprise a hard short coupled to a voltage source.

15. The memory device of claim 13, wherein the reference lines each comprise a conductor coupled to a voltage source.

16. The memory device of claim 13, and further comprising an equilibration circuit coupled to the first and second digit lines to equilibrate the first and second digit lines to ½ Vcc.

17. A memory device comprising:
a plurality of memory cell capacitors;
row lines selectively couplable to the plurality of memory cell capacitors;
sense circuitry coupled to first and second digit lines;
a reference line containing a charge having a voltage between Vss and ½ Vcc, the reference line couplable to the second digit line; and
control circuitry to activate one of the row lines and to couple the second digit line to the sense circuitry such that the second digit line voltage is reduced below ½ Vcc.

18. The memory device of claim 17, and further comprising:
a second reference line containing a charge having a voltage of X, where Vss<X<½ Vcc, the second reference line is couplable to the first digit line; and
wherein the control circuitry is adapted to activate another of the row lines and couple the first digit line to the sense amplifier such that the first digit line voltage is reduced below ½ Vcc.

19. The memory device of claim 17, wherein the reference line comprises a hard short coupled to a voltage source.

20. The memory device of claim 17, wherein the reference line comprises a conductor coupled to a voltage source.

21. The memory device of claim 17, and further comprising an equilibration circuit coupled to the first and second digit lines to equilibrate the first and second digit lines to ½ Vcc.

22. A memory device, comprising:
a plurality of memory cell capacitors;
a plurality of word lines each selectively couplable to the plurality of memory cell capacitors;
an active and a complementary digit line selectively couplable to the plurality of memory cell capacitors;
sense circuitry coupled to the digit lines; and
a reference cell, having a predetermined voltage, to couple the complementary digit line to the sense circuitry when one of the memory cell capacitors is coupled to the active digit line.

23. The memory device of claim 22, wherein the predetermined voltage is between Vss and ½ Vcc.

24. The memory device of claim 22, wherein the predetermined voltage is between ½ Vcc and Vcc.

25. The memory device of claim 22, and further comprising:
a second reference cell, having a predetermined voltage, to couple the active digit line to the sense circuitry when one of the memory cell capacitors is coupled to the complementary digit line.

26. A memory device comprising:
a plurality of memory cell capacitors;
row lines selectively couplable to the plurality of memory cell capacitors;
sense circuitry couplable to first and second digit lines;
a first reference row couplable to a first non-volatile reference cell, the first reference cell programmed to conduct a specific current in response to activating the first reference row;
a second reference row couplable to a non-volatile second reference cell, the second reference cell programmed to conduct a specific current in response to activating the second reference row; and
control circuitry to activate one of the row lines and couple the first reference row line to the second digit line for a predetermined time or the second reference row to the first digit line for a predetermined time.

27. The memory device of claim 26, and further comprising an equilibration circuit coupled to the first and second digit lines to equilibrate the first and second digit lines to ½ Vcc.

28. The DRAM of claim 26 wherein the second digit line is reduced below ½ Vcc in response to the reference row.

29. A memory device comprising:
   a plurality of memory cell capacitors;
   row lines selectively couplable to the plurality of memory cell capacitors;
   sense circuitry couplable to first and second digit lines;
   a first reference row couplable to a first non-volatile reference cell, the first reference cell programmed to conduct a specific current in response to activating the first reference row;
   a second reference row couplable to a non-volatile second reference cell, the second reference cell programmed to conduct a specific current in response to activating the second reference row;
   control circuitry to activate one of the row lines and couple the first reference row line to the second digit line for a predetermined time or the second reference row to the first digit line for a predetermined time; and
   an equilibration circuit coupled to the first and second digit lines to equilibrate the first and second digit lines to ½ Vcc.

30. A data processing system comprising:
   a processor; and
   a memory device coupled to the processor and comprising:
      a plurality of memory cell capacitors;
      row lines selectively couplable to the plurality of memory cell capacitors;
      sense circuitry couplable to first and second digit lines;
      a reference line containing a charge having a voltage of X, where $Vss<X<½ Vcc$, the reference line is couplable to the second digit line; and
      control circuitry to activate one of the row lines and couple the second digit line to the sense amplifier such that the second digit line voltage is reduced below ½ Vcc.

31. The data processing system of claim 30, and further comprising:
   a second reference line containing a charge having a voltage of X, where $Vss<X<½ Vcc$, the second reference line is couplable to the first digit line.

32. The data processing system of claim 30, wherein the reference line comprises a hard short coupled to a voltage source.

33. The data processing system of claim 30, wherein the reference line comprises a conductor coupled to a voltage source.

34. The data processing system of claim 30, wherein the reference line comprises a non-volatile memory cell.

35. The DRAM of claim 30, and further comprising an equilibration circuit coupled to the first and second digit lines to equilibrate the first and second digit lines to ½ Vcc.

36. A data processing system comprising:
   a processor; and
   a memory device coupled to the processor and comprising:
      a plurality of memory cell capacitors;
      row lines selectively couplable to the plurality of memory cell capacitors;
      sense circuitry couplable to first and second digit lines;
      a reference line coupled to a reference voltage X, where $Vss<X ½ Vcc$, the reference line is couplable to the second digit line; and
      control circuitry to activate one of the row lines and couple the second digit line to the sense amplifier such that the second digit line voltage is reduced below ½ Vcc.

37. A data processing system comprising:
   a processor; and
   a memory device coupled to the processor and comprising:
      a plurality of memory cell capacitors;
      row lines selectively couplable to the plurality of memory cell capacitors;
      sense circuitry coupled to first and second digit lines;
      a reference line coupled to a reference voltage X, where $½ Vcc<X<Vcc$, the reference line is couplable to a reference digit line; and
      control circuitry to activate one of the row lines and couple the reference digit line to the sense amplifier such that the reference digit line voltage is reduced below ½ Vcc.

38. A data processing system comprising:
   a processor; and
   a memory device coupled to the processor and comprising:
      a plurality of memory cell capacitors;
      row lines selectively couplable to the plurality of memory cell capacitors;
      sense circuitry couplable to first and second digit lines;
      a reference row couplable to a non-volatile reference cell, the reference cell is programmed to conduct a specific current in response activating the reference row; and
   control circuitry to activate one of the row lines and couple the reference row line to the second digit line for a predetermined time.

* * * * *

UNITED STATES PATENT AND TRADEMARK OFFICE
CERTIFICATE OF CORRECTION

PATENT NO. : 6,731,556 B2
DATED : May 4, 2004
INVENTOR(S) : Derner et al.

It is certified that error appears in the above-identified patent and that said Letters Patent is hereby corrected as shown below:

Column 3,
Line 45, between "cell" and "is" insert -- $214_2$ --
Line 47, "$Refl_1$" should be -- $Ref_1$ --

Column 7,
Line 7, change "DRAM" to -- memory device --

Column 8,
Line 3, change "DRAM" to -- data processing system --
Line 16, change "Vss<X ½ Vcc" to -- Vss<X<½Vcc --

Signed and Sealed this

Twenty-fourth Day of May, 2005

JON W. DUDAS
*Director of the United States Patent and Trademark Office*